US012727281B2

(12) United States Patent
Morea et al.

(10) Patent No.: US 12,727,281 B2
(45) Date of Patent: Sep. 1, 2026

(54) ELECTROMAGNETIC RADIATION DETECTORS WITH LATTICE-MATCHED EPITAXIAL ANTI-REFLECTION STRUCTURES

(71) Applicant: Apple Inc., Cupertino, CA (US)

(72) Inventors: Matthew T. Morea, Cupertino, CA (US); Daniel Mahgerefteh, Campbell, CA (US); Dylan N. Rees, Los Gatos, CA (US); Mark A. Arbore, Los Altos, CA (US); Romain F. Chevallier, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 378 days.

(21) Appl. No.: 18/388,449

(22) Filed: Nov. 9, 2023

(65) Prior Publication Data

US 2024/0405135 A1 Dec. 5, 2024

Related U.S. Application Data

(60) Provisional application No. 63/424,694, filed on Nov. 11, 2022.

(51) Int. Cl.

| | |
|---|---|
| ***H10F 77/40*** | (2025.01) |
| ***G01J 1/02*** | (2006.01) |
| ***H10F 77/124*** | (2025.01) |
| ***H10F 77/169*** | (2025.01) |

(52) U.S. Cl.
CPC .......... *H10F 77/413* (2025.01); *G01J 1/0214* (2013.01); *H10F 77/1248* (2025.01); *H10F 77/169* (2025.01)

(58) Field of Classification Search
CPC .................................................... H10F 77/413
See application file for complete search history.

(56) References Cited

U.S. PATENT DOCUMENTS

| | | | |
|---|---|---|---|
| 4,794,439 | A | 12/1988 | Webb et al. |
| 4,984,032 | A | 1/1991 | Miura et al. |
| 4,999,696 | A | 3/1991 | Gentner et al. |
| 5,483,261 | A | 1/1996 | Yasutake |
| 5,488,204 | A | 1/1996 | Mead et al. |
| 5,825,352 | A | 10/1998 | Bisset et al. |

(Continued)

FOREIGN PATENT DOCUMENTS

| | | |
|---|---|---|
| EP | 2918983 | 9/2015 |
| JP | 2000163031 | 6/2000 |

(Continued)

OTHER PUBLICATIONS

Jones et al., "A Polarization Sensitive Bolometric Receiver for Observations of the Cosmic Microwave Background," SPIE, 4855-227-238, 2003.

*Primary Examiner* — Edwin C Gunberg
(74) *Attorney, Agent, or Firm* — Brownstein Hyatt Farber Schreck, LLP

(57) ABSTRACT

An electromagnetic radiation detectors includes anti-reflective epitaxial structures incorporated into an epitaxial stack of the electromagnetic radiation detector. An anti-reflective structures as described herein are grown between (and thereby connect) two lattice-matched epitaxial layers that have different refractive indices. The anti-reflective structure reduces Fresnel reflections that would otherwise occur if the two epitaxial layers were directly connected.

20 Claims, 9 Drawing Sheets

(56) References Cited

U.S. PATENT DOCUMENTS

| | | | |
|---|---|---|---|
| 5,835,079 | A | 11/1998 | Shieh |
| 5,880,411 | A | 3/1999 | Gillespie et al. |
| 6,188,391 | B1 | 2/2001 | Seely et al. |
| 6,198,099 | B1 | 3/2001 | Kim |
| 6,310,610 | B1 | 10/2001 | Beaton et al. |
| 6,320,189 | B1 | 11/2001 | Ouvrier-Buffet |
| 6,410,917 | B1 | 6/2002 | Choi |
| 6,667,479 | B2 | 12/2003 | Ray |
| 6,690,014 | B1 | 2/2004 | Gooch |
| 6,690,387 | B2 | 2/2004 | Zimmerman et al. |
| 7,015,894 | B2 | 3/2006 | Morohoshi |
| 7,184,064 | B2 | 2/2007 | Zimmerman et al. |
| 7,227,145 | B2 | 6/2007 | Brouns |
| 7,268,349 | B2 | 9/2007 | Moon et al. |
| 7,405,403 | B2 | 7/2008 | Vilain |
| 7,450,246 | B2 | 11/2008 | Boesser et al. |
| 7,655,909 | B2 | 2/2010 | Schimert et al. |
| 7,663,607 | B2 | 2/2010 | Hotelling et al. |
| 7,825,379 | B2 | 11/2010 | Nakaki |
| 8,039,798 | B2 | 10/2011 | Oda |
| 8,441,094 | B2 | 5/2013 | Brueckl et al. |
| 8,513,605 | B2 | 8/2013 | Beratan |
| 8,530,933 | B2 | 9/2013 | Ogura |
| 8,610,070 | B2 | 12/2013 | Schimert et al. |
| 9,076,906 | B2 | 7/2015 | Ogura et al. |
| 9,163,998 | B2 | 10/2015 | Nam et al. |
| 9,243,959 | B2 | 1/2016 | Roh et al. |
| 9,411,055 | B2 | 8/2016 | Yoon et al. |
| 9,417,134 | B2 | 8/2016 | Koechlin et al. |
| 9,939,322 | B2 | 4/2018 | Kangas et al. |
| 10,323,987 | B2 | 6/2019 | Kangas et al. |
| 10,670,466 | B2 | 6/2020 | Kangas et al. |
| 10,900,841 | B2 | 1/2021 | Weiler et al. |
| 2006/0081768 | A1 | 4/2006 | Dutta |
| 2012/0103406 | A1 | 5/2012 | Kayes et al. |
| 2015/0362374 | A1 | 12/2015 | Wheeler et al. |
| 2017/0288024 | A1* | 10/2017 | Reznicek ............... H10D 62/53 |
| 2020/0194486 | A1 | 6/2020 | Na |
| 2021/0175268 | A1* | 6/2021 | Kakushima ............. H10F 39/80 |
| 2024/0047591 | A1 | 2/2024 | Morea et al. |
| 2024/0047602 | A1 | 2/2024 | Morea et al. |
| 2024/0128398 | A1* | 4/2024 | Fang .................... H10H 20/013 |
| 2025/0160047 | A1 | 5/2025 | Huang et al. |

FOREIGN PATENT DOCUMENTS

| | | |
|---|---|---|
| JP | 2002342033 | 11/2002 |
| JP | 2012099806 | 5/2012 |
| JP | 2013047658 | 3/2013 |
| JP | 2013530386 | 7/2013 |
| KR | 20060092879 | 8/2006 |
| KR | 100658114 | 12/2006 |
| KR | 20140075462 | 6/2014 |
| WO | WO 10/094051 | 8/2010 |
| WO | WO 16/112355 | 7/2016 |

* cited by examiner

ELECTROMAGNETIC RADIATION DETECTORS WITH LATTICE-MATCHED EPITAXIAL ANTI-REFLECTION STRUCTURES

CROSS-REFERENCE TO RELATED APPLICATION

This application is a nonprovisional and claims the benefit under 35 U.S.C. § 119 (e) of U.S. Provisional Patent Application No. 63/424,694, filed Nov. 11, 2022, the contents of which are incorporated herein by reference as if fully described herein.

TECHNICAL FIELD

Embodiments described herein relate to electromagnetic radiation detectors, and in particular to electromagnetic radiation detectors that include lattice-matched epitaxial anti-reflection structures.

BACKGROUND

Sensors are included in many of today's electronic devices, including electronic devices such as smartphones, computers (e.g., tablet computers or laptop computers), wearable electronic devices (e.g., electronic watches, smart watches, or health monitors), and so on. Sensors may variously sense the presence of objects, distances to and/or movement of objects, compositions of objects, and so on. Electromagnetic radiation detectors (also referred to as electromagnetic radiation sensors, optical sensors, and optical detectors) are commonly used in sensors to detect light (e.g., visible and/or infrared light) collected or otherwise received by the sensor. Depending on the application of a given sensor, an electromagnetic radiation detector may be used to measure light across a range of wavelengths in different circumstances, and thus it would be desirable to provide electromagnetic radiation detectors that have similar performance across these wavelengths.

SUMMARY

Embodiments described herein relate to electromagnetic radiation detectors that incorporate anti-reflective epitaxial structures to reduce internal reflections within an electromagnetic radiation detector. Some embodiments are direct to an electromagnetic radiation detector with an epitaxial stack, where the epitaxial stack includes a first epitaxial layer, a second epitaxial layer, and an anti-reflective epitaxial structure connecting the first epitaxial layer to the second epitaxial layer. The anti-reflective epitaxial structure includes a plurality of layer groups, such that each layer group of the plurality of layer groups includes a corresponding plurality of epitaxial layers with a different corresponding average refractive index.

In some variations, the first epitaxial layer has a higher refractive index than the second epitaxial layer, and the average refractive indices of the plurality of epitaxial layers decrease in a direction from the first epitaxial layer to the second epitaxial layer. Additionally or alternatively, the first epitaxial layer, the second epitaxial layer, and the plurality of layer groups are lattice matched. In some variations, the first epitaxial layer is formed from a first semiconductor material, the second epitaxial layer is formed from a second semiconductor material, and each layer group of the plurality of layer groups includes: a first layer formed from the second semiconductor material, and a second layer formed from the first semiconductor material. Additionally or alternatively, each layer group of the plurality of layer groups has a common thickness. In some variations, the first epitaxial layer is a buffer layer, and the second epitaxial layer is an electromagnetic radiation absorber layer. In other variations, the first epitaxial layer is a substrate, and the second epitaxial layer is a buffer layer.

Other variations are directed to an electromagnetic radiation detector with an epitaxial stack, where the epitaxial stack includes a first epitaxial layer formed from a first semiconductor material, a second epitaxial layer formed from a second semiconductor material, and an anti-reflective epitaxial structure connecting the first epitaxial layer to the second epitaxial layer. The anti-reflective epitaxial structure is formed from a layer of a semiconductor alloy material with varying composition between the first epitaxial layer and the second epitaxial layer, and the first epitaxial layer, the second epitaxial layer, and the anti-reflective epitaxial structure are lattice matched. In some of these variations, the semiconductor alloy material is a quaternary semiconductor material.

In some of these variations, the layer of the semiconductor alloy is graded from the first semiconductor material to the second semiconductor material. In some of these variations, the first semiconductor material is an indium gallium arsenide material, the second semiconductor material is an indium arsenide phosphide material, and the semiconductor alloy material is an indium gallium arsenide phosphide material. In some variations, the first epitaxial layer is a buffer layer, and the second epitaxial layer is an electromagnetic radiation absorber layer.

Other embodiments are directed to an electromagnetic radiation detector that includes an epitaxial stack, where the epitaxial stack includes a substrate; a first set of buffer layers positioned above the substrate, a first electromagnetic radiation absorber layer positioned above the set of buffer layers, a cap layer positioned above the electromagnetic radiation absorber layer, and a first anti-reflective epitaxial structure connecting the first electromagnetic radiation absorber layer to the cap layer.

In some variations, the epitaxial stack includes a second anti-reflective epitaxial structure connecting the substrate to the first set of buffer layers. In some of these variations, the cap layer has a first refractive index, a buffer layer of the first set of buffer layers has a second refractive index, and the first anti-reflective epitaxial structure includes a layer having a third refractive index that is the geometric mean of the first refractive index and the second refractive index. In some of these variations, the second anti-reflective epitaxial structure includes a plurality of layer groups, and each layer group of the plurality of layer groups includes a corresponding plurality of epitaxial layers with a different corresponding average refractive index. In other variations, the cap layer is formed from a first semiconductor material, a buffer layer of the first set of buffer layers is formed from a second semiconductor material, and the first anti-reflective epitaxial structure includes a first epitaxial layer formed from the first semiconductor material and a second epitaxial layer formed from the second semiconductor material. In some of these variations, the first epitaxial layer and the second epitaxial layer have the same thickness.

In other variations, the epitaxial stack includes a second set of buffer layers and a second electromagnetic radiation detector. In some of these variations, the epitaxial stack includes a second anti-reflective epitaxial structure connecting the second electromagnetic radiation absorber layer to the second set of buffer layers.

In addition to the exemplary aspects and embodiments described above, further aspects and embodiments will become apparent by reference to the drawings and by study of the following description.

BRIEF DESCRIPTION OF THE DRAWINGS

Reference will now be made to representative embodiments illustrated in the accompanying figures. It should be understood that the following descriptions are not intended to limit this disclosure to one included embodiment. To the contrary, the disclosure provided herein is intended to cover alternatives, modifications, and equivalents as may be included within the spirit and scope of the described embodiments, and as defined by the appended claims.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Described herein are electromagnetic radiation detectors including anti-reflective epitaxial structures incorporated into an epitaxial stack of the electromagnetic radiation detector. An anti-reflective structure as described herein is grown between (and thereby connects) two lattice-matched epitaxial layers that have different refractive indices. The anti-reflective structure reduces Fresnel reflections that would otherwise occur if the two epitaxial layers were directly connected.

These and other embodiments are discussed below with reference to FIGS. 1-7. However, those skilled in the art will readily appreciate that the detailed description given herein with respect to these Figures is for explanatory purposes only and should not be construed as limiting.

Figure 1:
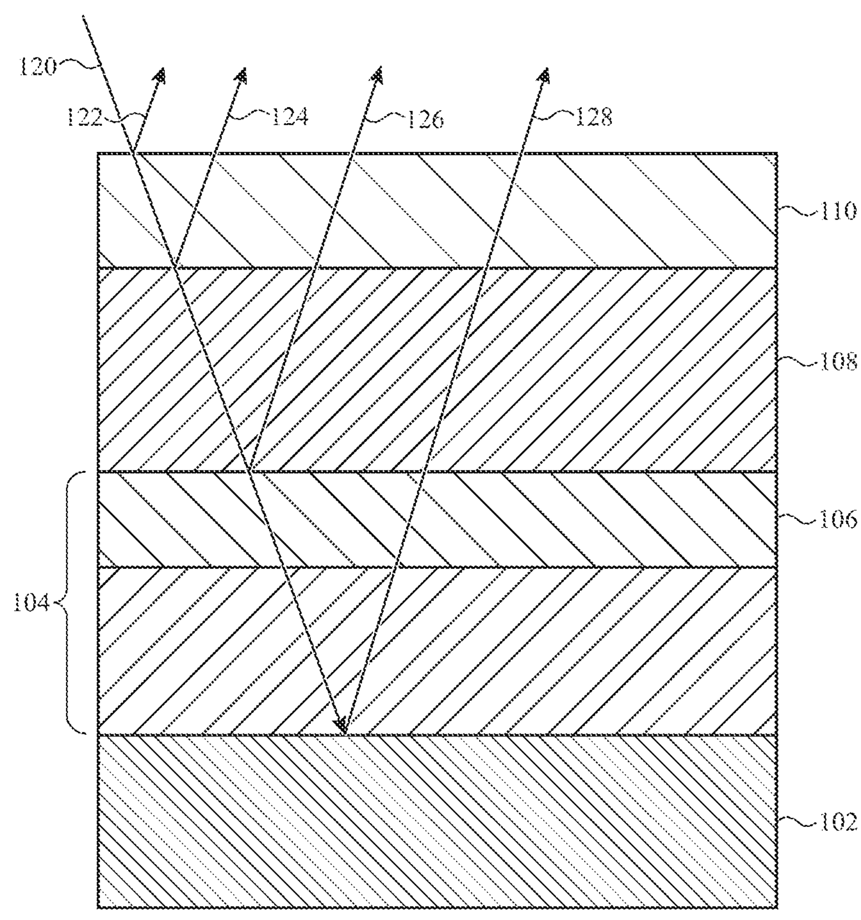
FIG. 1 shows a cross-sectional view of an electromagnetic radiation detector, such as described herein.

FIG. 1 shows a cross-sectional side view of an electromagnetic radiation detector 100 in which Fresnel reflections occur between different layers of the electromagnetic radiation detector 100. As shown here, the electromagnetic radiation detector 100 includes a substrate 102, a set of buffer layers 104 including a top buffer layer 106, an electromagnetic radiation absorber layer 108, and a cap layer 110. The set of buffer layers 104, electromagnetic radiation absorber layer 108, and the cap layer are formed as a stack of epitaxial layers that is grown on the substrate 102. In the variation shown in FIG. 1, the set of buffer layers 104 is grown directly on the substrate 102, the electromagnetic radiation absorber layer 108 is grown directly on the set of buffer layers 104 (specifically, on the top buffer layer 106), and the cap layer 110 is grown directly on the electromagnetic radiation absorber layer 108.

The epitaxial layers of the electromagnetic radiation detector 100 may be formed from semiconductor materials, such as III-V or II-VI type semiconductor materials. Depending on the materials used to form a detector, there may be a lattice mismatch between the substrate 102 and the electromagnetic radiation absorber layer 108, such that the lattice constant of the substrate 102 is different than the lattice constant of the electromagnetic radiation absorber layer 108. For example, instances where the substrate 102 is formed from an indium phosphide material (InP) and the electromagnetic radiation absorber layer 108 is formed from an indium gallium arsenide material ($In_xGa_{1-x}As$), there may be a lattice mismatch between these layers. The set of buffer layers 104 may provide a gradual transition between the lattice constant of the substrate 102 and the lattice constant of the electromagnetic radiation absorber layer 108, thereby reducing the crystal dislocations (and resulting dark current during detector operation) that would otherwise occur if the electromagnetic radiation absorber layer 108 were to be grown directly on the substrate 102. Specifically, the top buffer layer 106 is lattice matched to the electromagnetic radiation absorber layer 108 at the interface between the top buffer layer 106 and the electromagnetic radiation absorber layer 108. The set of buffer layers 104 may include any layer or number of layers as may be needed to provide the change in lattice constant.

During operation of the electromagnetic radiation detector 100, the top buffer layer 106 and the cap layer 110 act as anode and cathode layers (respectively, or vice versa), such that a biasing signal (i.e., voltage and/or current) may be applied across the electromagnetic radiation absorber layer 108 via the top buffer layer 106 and the cap layer 110. As the electromagnetic radiation detector 100 is exposed to electromagnetic radiation (e.g., photons), the electromagnetic radiation absorber layer 108 absorbs photons and thereby generates electron-hole pairs, which causes a photocurrent to flow in the electromagnetic radiation detector 100 between the anode and cathode. This photocurrent may be measured to determine the amount of electromagnetic radiation absorbed by the electromagnetic radiation absorber layer 108, which is representative of the amount of electromagnetic radiation received by the electromagnetic radiation detector 100. The electromagnetic radiation absorber layer 108 and the additional electromagnetic radiation absorber layer 108 may be designed (e.g., by choosing the material, thickness, etc.) to absorb certain wavelengths of light at a higher efficiency than others, thereby setting an operating wavelength range for the electromagnetic radiation detector 100.

Within the electromagnetic radiation detector 100, the interfaces between different layers may result in Fresnel reflections due to the difference in refractive index between immediately adjacent layers. Shown in FIG. 1 is a beam of input light 120 incident on the electromagnetic radiation detector 100. When light first contacts the electromagnetic radiation detector 100, the refractive index difference between the cap layer 110 and the surrounding air may cause a first Fresnel reflection (as illustrated by arrow 122). Additional Fresnel reflections occur at the interfaces within the epitaxial stack of electromagnetic radiation detector 100, including at the interfaces between the cap layer 110 and the electromagnetic radiation absorber layer 108 (illustrated by arrow 124), between the electromagnetic radiation absorber layer 108 and the set of buffer layers 104 (illustrated by arrow 126), and between the set of buffer layers 104 and the substrate 102 (illustrated by arrow 128). These internal Fresnel reflections, while relatively small, may interfere within the electromagnetic radiation detector 100 to form etalons, which causes the photocurrent generated in electromagnetic radiation detector 100 to vary as a function of wavelength (i.e., the wavelength of the light absorbed by the electromagnetic radiation absorber layer 108). This may impact the accuracy of measurements performed by the electromagnetic radiation detector 100, especially when the electromagnetic radiation detector 100 is used to detect light across a range of different wavelengths.

Accordingly, it may be desirable to reduce the magnitude of internal Fresnel reflections within an electromagnetic radiation detector such as electromagnetic radiation detector 100. While conventional anti-reflective coatings that include one or more layers of dielectric material may be applied to an exterior surface of the electromagnetic radiation detector (e.g., to reduce the Fresnel reflection 122 between the cap layer 110 and air), these coatings may not be utilized within the epitaxial stack itself. As such, the following embodiments describe examples of anti-reflective epitaxial structure for reducing internal Fresnel reflections within an electromagnetic radiation detector. As used herein, the term "anti-reflective epitaxial structure" refers to one or more layers of an epitaxial stack that connects a first epitaxial layer to a second epitaxial layer (i.e., a first interface connects the anti-reflective epitaxial structure to the first epitaxial layer and a second interface connects the anti-reflective epitaxial structure to the second epitaxial layer), and is configured to reduce internal Fresnel reflections occurring between the first and second epitaxial layers as compared to an otherwise identical detector in which the first epitaxial layer is directly connected to the second epitaxial layer (i.e., internal Fresnel reflections that would occur at an interface between the first and second epitaxial layers). In this way, the layer(s) of the anti-reflective epitaxial structure are grown between the first and second epitaxial layers.

Stepped Graded Interface

In some variations, an anti-reflective epitaxial structure as described herein provides a stepped graded interface between a first epitaxial layer and second epitaxial layer of an electromagnetic radiation detector. In these variations, the anti-reflective epitaxial structure includes a plurality of layer groups that each has a different average refractive index. Collectively, the plurality of layer groups provides a graded refractive index transition between the first and second epitaxial layers.

Figure 2:
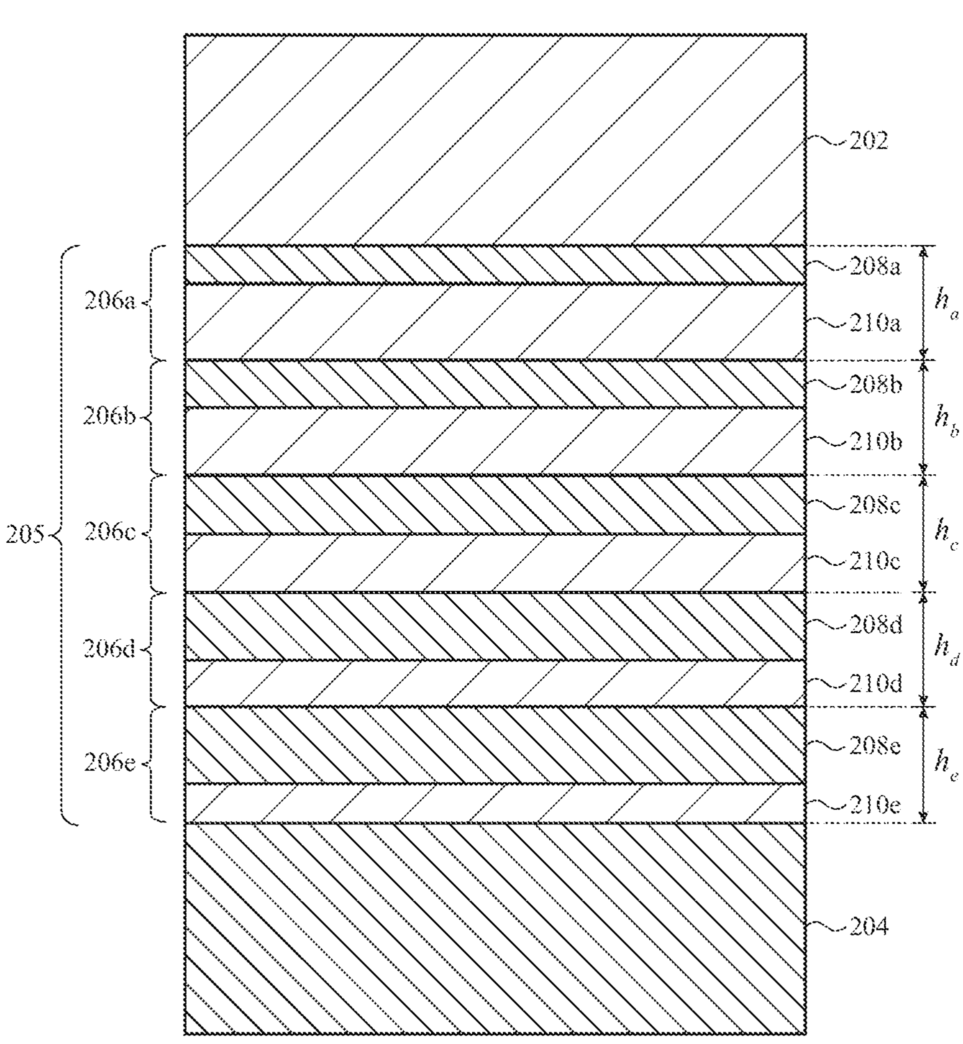
FIG. 2 shows a cross-sectional view of an electromagnetic radiation detector, such as described herein, that includes a stepped, graded epitaxial anti-reflection structure.

FIG. 2 shows a cross-sectional view of a portion of one such example of an electromagnetic radiation detector 200. The electromagnetic radiation detector 200 includes a first epitaxial layer 202 and a second epitaxial layer 204 connected by an anti-reflective epitaxial structure 205. The first epitaxial layer 202 and second epitaxial layer 204 may represent any pair of epitaxial layers as described with respect to the electromagnetic radiation detector 100 of FIG. 1 in which there is a refractive index difference between the adjacent epitaxial layers. For example, the anti-reflective epitaxial structure 205 may be positioned between a substrate and a buffer layer (e.g., the substrate 102 and a bottommost layer of the set of buffer layers 104), a buffer layer and an electromagnetic radiation absorber layer (e.g., the top buffer layer 106 and the electromagnetic radiation absorber layer 108), or between an electromagnetic radiation absorber layer and a cap layer (e.g., the electromagnetic radiation absorber layer 108 and the cap layer 110).

The anti-reflective epitaxial structure 205 includes a plurality of layer groups **206*a*-206*e*. While five layer groups 206*a*-206*e* are shown in FIG. 2, it should be appreciated that the anti-reflective epitaxial structure 205 may include any number of layer groups 206*a*-206*e* as may be desired for a particular electromagnetic radiation detector design. Each of the layer groups 206*a*-206*e* includes a plurality of epitaxial layers. In the example shown in FIG. 2, each layer group has two epitaxial layers having different refractive indices (e.g., the first layer group 206*a* includes a first epitaxial layer 208*a* and a second epitaxial layer 210*a*, the second layer group 206*b* includes a first epitaxial layer 208*b* and a second epitaxial layer 210*b*, the third layer group 206*c* includes a first epitaxial layer 208*c* and a second epitaxial layer 210*c*, the fourth layer group 206*d* includes a first epitaxial layer 208*d* and a second epitaxial layer 210*d*, and the fifth layer group 206*e* includes a first epitaxial layer 208*e* and a second epitaxial layer 210*e***). In other variations, some or all of the layer groups may include three or more epitaxial layers having different refractive indices.

Each of the layer groups **206*a*-206*e* has a corresponding average refractive index that depends on the relative thicknesses of the plurality of epitaxial layers within the layer group, as well as the refractive indices of these epitaxial layers. If a layer group of the anti-reflective epitaxial structure 205 is sufficiently thin compared to the wavelength of incoming light, the incoming light will experience a given layer group as a single layer having an effective refractive index that is the average refractive index of the layer group. This allows the layer groups 206*a*-206*e* to collectively gradually transition the refractive index between the refractive index of the first epitaxial layer 202 and the refractive index of the second epitaxial layer 204**.

For example, the first epitaxial layer 202 may have a higher refractive index than that of the second epitaxial layer 204. In these instances, the average refractive indices of the plurality of layer groups **206*a*-206*e* will decrease in a direction from the first epitaxial layer 202 and the second epitaxial layer 204. Specifically, the first layer group 206*a* has a higher average refractive index than the second layer group 206*b*, which in turn has a higher average refractive index than the third layer group 206*c*, and so on. Without the anti-reflective epitaxial structure 205, incoming light would experience an abrupt refractive index change at the interface between the first epitaxial layer 202 and the second epitaxial layer 204. The anti-reflective epitaxial structure 205 instead provides a gradual refractive index change due to the changing average refractive index of the layer groups 206*a*-206*e*, which in turn reduces the amount of light that is reflected when light passes from the first epitaxial layer 202 to the second epitaxial layer 204**.

To avoid adding additional dark current into the electromagnetic radiation detector 200, the first epitaxial layer 202 and the second epitaxial layer 204 are preferably lattice matched (i.e., have the same lattice constant), and the plurality of layer groups 206*a*-206*e* (including the constituent layers within each layer group) is lattice matched with the first and second epitaxial layers 202, 204. In some variations, the layer groups may include epitaxial layers formed from the same materials as the first and second epitaxial layers 202, 204. For example, the first epitaxial layer 202 may be formed from a first semiconductor material and the second layers 210*a*-210*e* of the plurality of layer groups 206*a*-206*e* are formed from the first semiconductor material. Similarly, the second epitaxial layer 204 may be formed from a second semiconductor material having a different refractive index from the first semiconductor material, and the first layers 208*a*-208*e* of the plurality of layer groups 206*a*-206*e* are formed form the second semiconductor material. In these instances, the anti-reflective epitaxial structure 205 forms a binary superlattice in which the anti-reflective epitaxial structure 205 alternates between layers of the first material and the second material. It should be appreciated that the anti-reflective epitaxial structure 205 may include one or more materials that are different from the first and second materials, respectively, forming the first and second epitaxial layers 202, 204.

While the layer groups 206*a*-206*e* are shown in FIG. 2 as having the same thickness (e.g., thicknesses $h_a$-$h_e$ corresponding to the layer groups 206*a*-206*e* are depicted in FIG. 2), it should be appreciated that different layer groups 206*a*-206*e* within the anti-reflective epitaxial structure 205 may have different thicknesses as may be desired. Accordingly, the thicknesses of the layer groups 206*a*-206*e*, as well as the relative thicknesses of the epitaxial layers within each of the layer groups 206*a*-206*e* may be selected to achieve a desired refractive index change across the anti-reflective epitaxial structure, which in turn may impact the amount of internal Fresnel reflections that occur as a function of wavelength.

Varying-Composition Graded Interface

In some variations, an anti-reflective epitaxial structure as described herein includes a varying-composition graded interface between a first epitaxial layer and second epitaxial layer of an electromagnetic radiation detector. In these variations, the anti-reflective epitaxial structure includes a layer of a semiconductor alloy (e.g., a quaternary semiconductor material) with varying composition between the first and second epitaxial layers. This varying composition provides a refractive index transition between first and second epitaxial layers.

Figure 3:
FIG. 3 shows a cross-sectional view of an electromagnetic radiation detector, such as described herein, that includes a varying composition, graded epitaxial anti-reflection structure.
Figure 3:
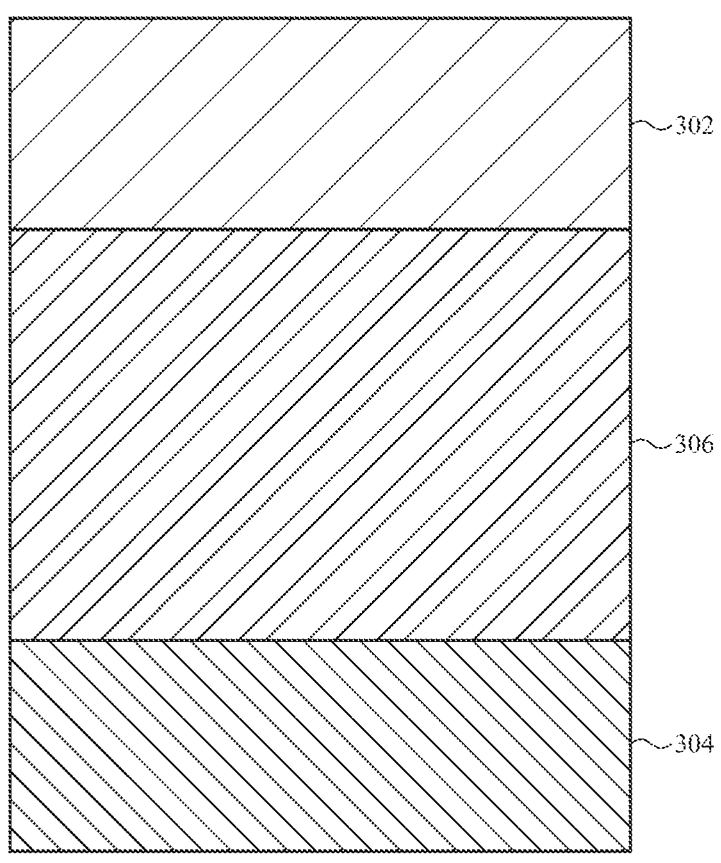

FIG. 3 shows a cross-sectional view of a portion of one such example of an electromagnetic radiation detector 300. The electromagnetic radiation detector 300 includes a first epitaxial layer 302 and a second epitaxial layer 304 separated by an anti-reflective epitaxial structure 306 that includes a layer of semiconductor alloy. The first epitaxial layer 302 and second epitaxial layer 304 are lattice matched, and may represent any pair of epitaxial layers as described with respect to the electromagnetic radiation detector 100 of FIG. 1 in which there is a refractive index difference between the adjacent epitaxial layers. For example, the anti-reflective epitaxial structure 306 may be positioned between a substrate and a buffer layer (e.g., the substrate 102 and a bottommost layer of the set of buffer layers 104), a buffer layer and an electromagnetic radiation absorber layer (e.g., the top buffer layer 106 and the electromagnetic radiation absorber layer 108), or between an electromagnetic radiation absorber layer and a cap layer (e.g., the electromagnetic radiation absorber layer 108 and the cap layer 110).

The first and second epitaxial layers 302, 304 may be respectively formed from a first semiconductor material and a second semiconductor material. The semiconductor alloy material of the anti-reflective epitaxial structure 306 may share at least one common element with the first and second semiconductor materials, and the composition of the alloy may be graded from the first semiconductor material to the second semiconductor material. For example, in some variations the first semiconductor material is an indium gallium arsenide material ($In_xGa_{1-x}As$), the second semiconductor material is an indium arsenide phosphide material ($InAs_yP_{1-y}$), and the semiconductor alloy of the anti-reflective epitaxial structure 306 is an indium gallium arsenide phosphide material ($In_xGa_{1-x}As_yP_{1-y}$). The indium gallium arsenide phosphide material is grown with y=1 at a first interface between the anti-reflective epitaxial structure 306 and the first epitaxial layer 302, and grown with x=1 at a second interface between the anti-reflective epitaxial structure 306 and the second epitaxial layer 304. In this way the indium gallium arsenide phosphide material is a quaternary material that changes from the first semiconductor material (e.g., $In_xGa_{1-x}As$) at the first interface to the second semiconductor material (e.g., $InAs_yP_{1-y}$) at the second interface.

Grading the material of the semiconductor alloy of the anti-reflective epitaxial structure 306 between the first and second semiconductor materials also transitions the refractive index of the anti-reflective epitaxial structure 306 between a first refractive index (i.e., that matches the refractive index of the first epitaxial layer 302) at the first interface to a second refractive index (i.e., that matches the refractive index of the second epitaxial layer 304) at the second interface. This gradual transition reduces reflection of light passing between the first and second epitaxial layers 302, 304 as compared to instances of electromagnetic radiation detectors in which the first epitaxial layer 302 is directly grown on the second epitaxial layer 304 (or vice versa). Additionally, the anti-reflective epitaxial structure 306 is lattice matched to both the first and second epitaxial layers 302, 304, which allows for reduction of the internal Fresnel reflections without significantly increasing dark current associated with lattice mismatches.

Wavelength-Tuned Interface

In some variations, an anti-reflective epitaxial structure as described herein includes one or more epitaxial layers designed to minimize reflections at a particular wavelength. In some of these instances, the anti-reflective epitaxial structure may approximate the performance of a quarter-wave anti-reflective coating, but may do so within the epitaxy of the electromagnetic radiation detector. Specifically, the anti-reflective epitaxial structure is designed such that when light of a target wavelength (i.e., the wavelength for which the design of the anti-reflective epitaxial structure is optimized) is passed through the anti-reflective epitaxial structure, light reflected from the various interfaces of the anti-reflective epitaxial structure destructively interfere. This can significantly reduce internal Fresnel reflections at the target wavelength, as well as at wavelengths around the target wavelength. These wavelength-tuned anti-reflective epitaxial structures may include a single epitaxial layer, or a plurality of epitaxial layers.

Figure 4:
FIGS. 4 and 5A-5C show cross-sectional views of variations of electromagnetic radiation detectors, such as described herein, that each include a wavelength tuned epitaxial anti-reflection structure.
Figure 4:
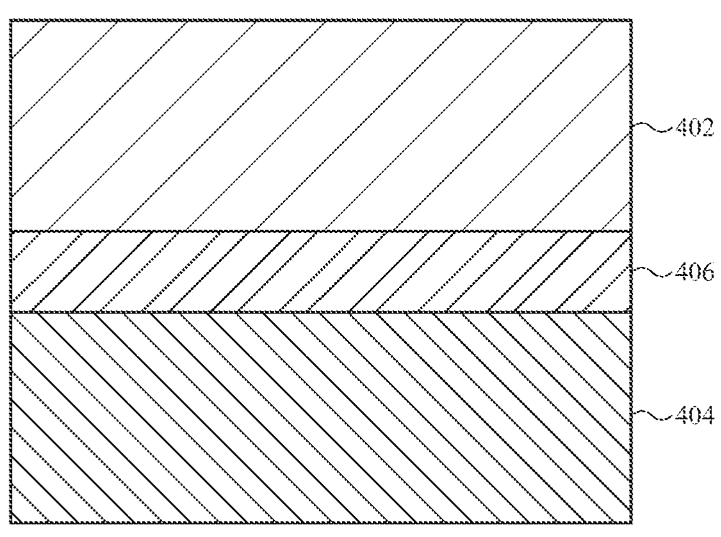

In some variations, a wavelength-tuned anti-reflective epitaxial structure includes a single epitaxial layer. FIG. 4 shows a cross-sectional view of a portion of one such example of an electromagnetic radiation detector 400. The electromagnetic radiation detector 400 includes an anti-reflective epitaxial structure 406 that includes a single layer of semiconductor material disposed between a first epitaxial layer 402 and a second epitaxial layer 404. The first epitaxial layer 402 and second epitaxial layer 404 are lattice matched, and may represent any pair of epitaxial layers as described with respect to the electromagnetic radiation detector 100 of FIG. 1 in which there is a refractive index difference between the adjacent epitaxial layers. For example, the anti-reflective epitaxial structure 406 may be positioned between a substrate and a buffer layer (e.g., the substrate 102 and a bottommost layer of the set of buffer layers 104), a buffer layer and an electromagnetic radiation absorber layer (e.g., the top buffer layer 106 and the electromagnetic radiation absorber layer 108), or between an electromagnetic radiation absorber layer and a cap layer (e.g., the electromagnetic radiation absorber layer 108 and the cap layer 110).

The single layer of the anti-reflective epitaxial structure 406 is lattice matched to the first and second epitaxial layers 402, 404, and is formed from a material having a refractive index that is the geometric mean of the refractive indices of the first and second epitaxial layers 402, 404. Additionally, the thickness of anti-reflective epitaxial structure 406 is selected to be a quarter of a target wavelength as discussed herein. In this way, when light of the target wavelength is passed between the first and second epitaxial layers 402, 404, reflections at an interface between the anti-reflective epitaxial structure 406 and the first epitaxial layer 402 will be out of phase with reflections at an interface between the anti-reflective epitaxial structure 406 and the second epitaxial layer 404, thereby resulting in destructive interference between these reflections.

In some variations, the single layer of the anti-reflective epitaxial structure 406 may be formed from a semiconductor alloy. For example, in some variations the first semiconductor material forming the first epitaxial layer 402 is an indium gallium arsenide material ($In_xGa_{1-x}As$), the second semiconductor material forming the second epitaxial layer 404 is an indium arsenide phosphide material ($InAs_yP_{1-y}$), and the semiconductor alloy of the anti-reflective epitaxial structure 406 is an indium gallium arsenide phosphide material ($In_xGa_{1-x}As_yP_{1-y}$) that is selected to have the desired refractive index.

In other variations, a wavelength-tuned anti-reflective epitaxial structure includes a plurality of epitaxial layers. In these instances, the anti-reflective epitaxial structure may connect a first epitaxial layer (formed from a first semiconductor material) to a lattice-matched second epitaxial layer (formed from a second semiconductor material), and may form a superlattice having a set of epitaxial layer pairs. Each epitaxial layer pair of the set of epitaxial layer pairs includes a first layer formed from the first semiconductor material and a second layer formed from the second semiconductor material, where the first layer and the second layer of the epitaxial layer pair have the same thickness. This thickness may be selected to obtain a desired reflection at a target wavelength, thereby prioritizing reducing reflections at the target wavelength.

Figure 5A:
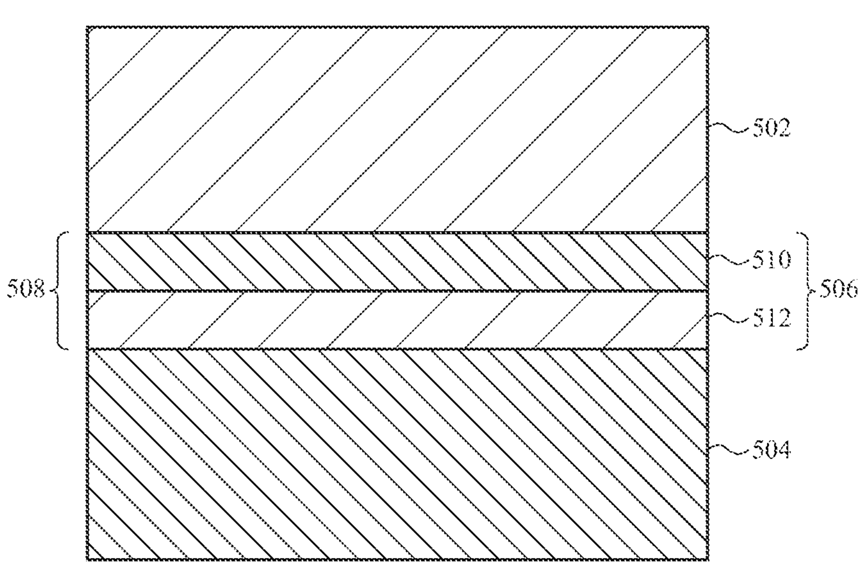

The superlattice may have any number of epitaxial layer pairs. For example, FIG. 5A shows a cross-sectional view of a portion of one example of an electromagnetic radiation detector 500. The electromagnetic radiation detector 500 includes a first epitaxial layer 502 formed from a first semiconductor material, a second epitaxial layer 504 formed from a second semiconductor material, and an anti-reflective epitaxial structure 506 connecting the first and second epitaxial layers 502, 504 (i.e., the anti-reflective epitaxial structure 506 is connected to the first epitaxial layer 502 at a first interface and is connected to the second epitaxial layer 504 at a second interface). The first epitaxial layer 502 and second epitaxial layer 504 are lattice matched, and may represent any pair of epitaxial layers as described with respect to the electromagnetic radiation detector 100 of FIG. 1.

The anti-reflective epitaxial structure 506 includes a superlattice having a single epitaxial layer pair 508, where the epitaxial layer pair 508 includes a first layer 510 formed from the second semiconductor material, and a second layer 512 formed from the first semiconductor material. The first layer 510 of the epitaxial layer pair 508 is connected to the first epitaxial layer 502, and the second layer 512 of the epitaxial layer pair 508 is connected to the second epitaxial layer 504 such that these layers alternate between the first and second semiconductor materials. The first and second layers 510, 512 of the epitaxial layer pair 508 have the same thickness, and are lattice matched to both the first epitaxial layer 502 and the second epitaxial layer 504. The thickness of the epitaxial layer pair 508 is selected to prioritize minimizing reflections at a target wavelength as discussed herein.

Figure 5B:
Figure 5B:
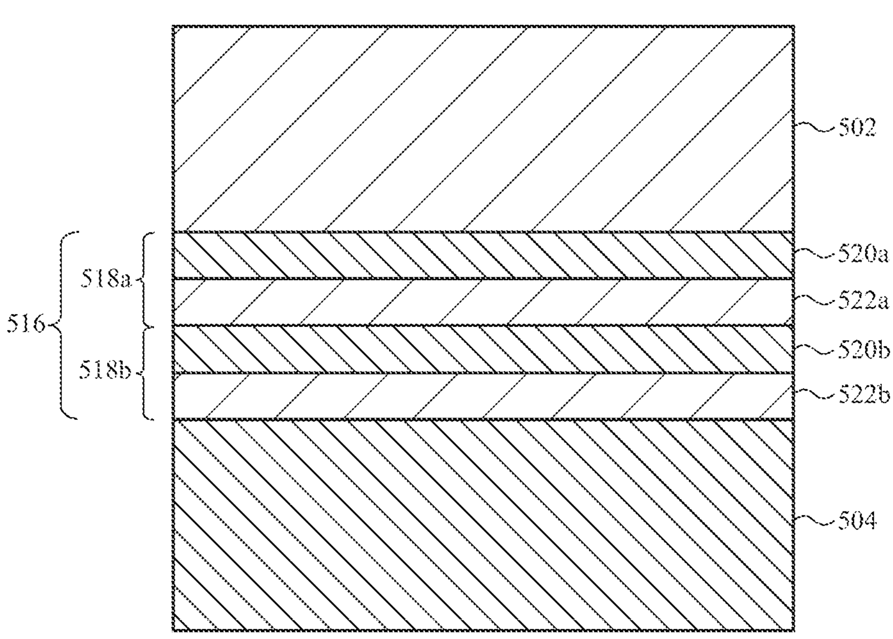

FIG. 5B shows a cross-sectional view of a portion of another example of an electromagnetic radiation detector 514. The electromagnetic radiation detector 514 includes a first epitaxial layer 502 formed from a first semiconductor material, a second epitaxial layer 504 formed from a second semiconductor material, which may be configured as described with respect to the corresponding layers of FIG. 5A. The electromagnetic radiation detector 514 further includes anti-reflective epitaxial structure 516 connecting the first and second epitaxial layers 502, 504 (i.e., the anti-reflective epitaxial structure 516 is connected to the first epitaxial layer 502 at a first interface and is connected to the second epitaxial layer 504 at a second interface).

The anti-reflective epitaxial structure 516 includes a superlattice having two epitaxial layer pairs 518*a*, 518*b*, where each of epitaxial layer pairs 518*a*, 518*b* includes a first layer formed from the second semiconductor material and a second layer formed from the first semiconductor material (e.g., the first epitaxial pair 518*a* includes a first layer 520*a* and a second layer 522*a*, and the second epitaxial pair 518*b* includes a first layer 520*b* and a second layer 522*b*). The superlattice of the anti-reflective epitaxial structure 516 is grown between the first and second epitaxial layers 502, 504, such that these layers alternate between the first and second semiconductor materials. The first and second layers of each of the epitaxial layer pairs 518*a*, 518*b*, have the same thickness, and are lattice matched to both the first epitaxial layer 502 and the second epitaxial layer 504. The thickness of the epitaxial layer pairs 518*a*, 518*b* is selected to prioritize minimizing reflections at a target wavelength as discussed herein. While the anti-reflective epitaxial structure 516 may be thicker than the anti-reflective epitaxial structure 506 of FIG. 5A, the anti-reflective epitaxial structure 516 may have improved anti-reflective performance at wavelengths around the target wavelength.

Figure 5C:
Figure 5C:
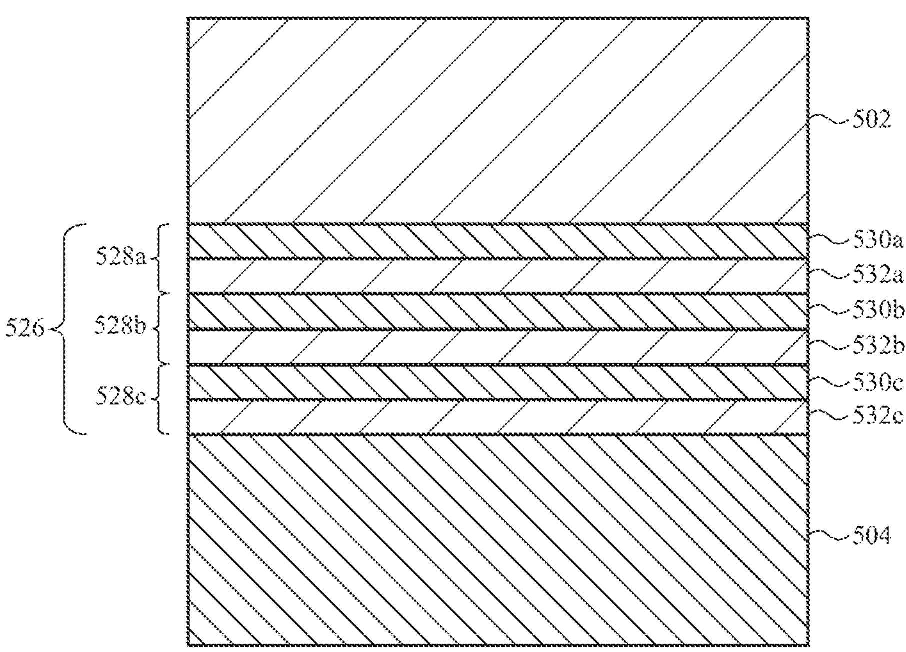

FIG. 5C shows a cross-sectional view of a portion of another example of an electromagnetic radiation detector 524. The electromagnetic radiation detector 524 includes a first epitaxial layer 502 formed from a first semiconductor material, a second epitaxial layer 504 formed from a second semiconductor material, which may be configured as described with respect to the correspond layers of FIG. 5A. The electromagnetic radiation detector 524 further includes anti-reflective epitaxial structure 526 connecting the first and second epitaxial layers 502, 504 (i.e., the anti-reflective epitaxial structure 526 is connected to the first epitaxial layer 502 at a first interface and is connected to the second epitaxial layer 504 at a second interface).

The anti-reflective epitaxial structure 526 includes a superlattice having three epitaxial layer pairs 528*a*-528*c*, where each of the epitaxial layer pairs 528*a*-528*c* includes a first layer formed from the second semiconductor material and a second layer formed from the first semiconductor material (e.g., the first epitaxial pair 528*a* includes a first layer 530*a* and a second layer 532*a*, the second epitaxial pair 528*b* includes a first layer 530*b* and a second layer 532*b*, and the third epitaxial pair 528*c* includes a first layer 530*c* and a second layer 532*c*). The superlattice of the anti-reflective epitaxial structure 526 is grown between the first and second epitaxial layers 502, 504 such that these layers alternate between the first and second semiconductor materials. The first and second layers of each of the epitaxial layer pairs 518*a*. 518*b* have the same thickness, and are lattice matched to both the first epitaxial layer 502 and the second epitaxial layer 504. The thickness of the epitaxial layer pairs 528*a*-528*c* is selected to prioritize minimizing reflections at a target wavelength as discussed herein.

Figure 6:
FIGS. 6 and 7 show cross-sectional views of variations of electromagnetic radiation detectors, such as described herein, that each include multiple epitaxial anti-reflection structures.
Figure 6:
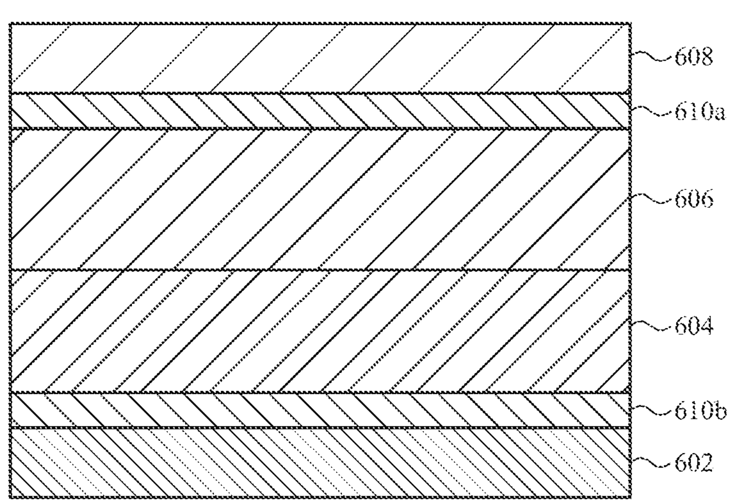

Example Electromagnetic Radiation Detectors Utilizing Anti-Reflective Epitaxial Structures FIG. 6 shows an example of an electromagnetic radiation detector 600 having a set of anti-reflective epitaxial structures configured to reduce internal Fresnel reflections within the electromagnetic radiation detector 600. The electromagnetic radiation detector 600 includes an epitaxial stack including substrate 602, a set of buffer layers 604 (which may be a single buffer layer or a plurality of buffer layers) positioned above the substrate 602, an electromagnetic radiation absorber layer 606 positioned above the set of buffer layers 604, and a cap layer 608 positioned above the electromagnetic radiation absorber layer 606. In the variation shown in FIG. 6, the electromagnetic radiation detector 600 further includes a first anti-reflective epitaxial structure 610*a* connecting the cap layer 608 to the electromagnetic radiation absorber layer 606, and a second anti-reflective epitaxial structure 610*b* connecting the set of buffer layers 604 to the substrate 602. It should be appreciated that in other instances, an electromagnetic radiation detector may include only one of the first anti-reflective epitaxial structure 610*a* or the second anti-reflective epitaxial structure 610*b*.

The first anti-reflective epitaxial structure 610*a* is lattice-matched to each of the cap layer 608 and the electromagnetic radiation absorber layer 606, and may be configured as any of the anti-reflective epitaxial structures described herein. Similarly, the second anti-reflective epitaxial structure 610*b* is lattice-matched to each of the substrate 602 and the set of buffer layers 604. To the extent that the set of buffer layers 604 includes multiple layers and/or a layer with a varying lattice constant, the second anti-reflective epitaxial structure 610*b* is lattice-matched to the set of buffer layers 604 at the interface between the second anti-reflective epitaxial structure 610*b*.

In some instances, it may be desirable to prioritize reducing the thickness of the first anti-reflective epitaxial structure 610*a* and to prioritize the performance of the second anti-reflective epitaxial structure 610*b* across a range of wavelengths. In these instances, the first anti-reflective epitaxial structure 610*a* may be configured as a wavelength-tuned interface (such as those described with respect to FIGS. 4 and 5A-5C), while the second anti-reflective epitaxial structure 610*b* may be configured as a graded interface (such as those described with respect to FIGS. 2 and 3).

In one non-limiting example, the substrate 602 is formed from an indium phosphide material, the set of buffer layers 604 is formed from one or more indium gallium arsenide materials, the electromagnetic radiation absorber layer 606 is formed from an indium gallium arsenide material, and the cap layer 608 is formed from an indium arsenide phosphide material. In this example, the first anti-reflective epitaxial structure 610*a* reduces reflections that would otherwise occur due to the refractive index difference between the indium arsenide phosphide material of the cap layer 608 and the indium gallium arsenide material of the electromagnetic radiation absorber layer 606. Similarly, the second anti-reflective epitaxial structure 610*b* reduces reflections that would otherwise occur due to the refractive index difference between the indium gallium arsenide material of the set of buffer layers 604 and the indium phosphide material of the substrate 602.

Figure 7:
Figure 7:
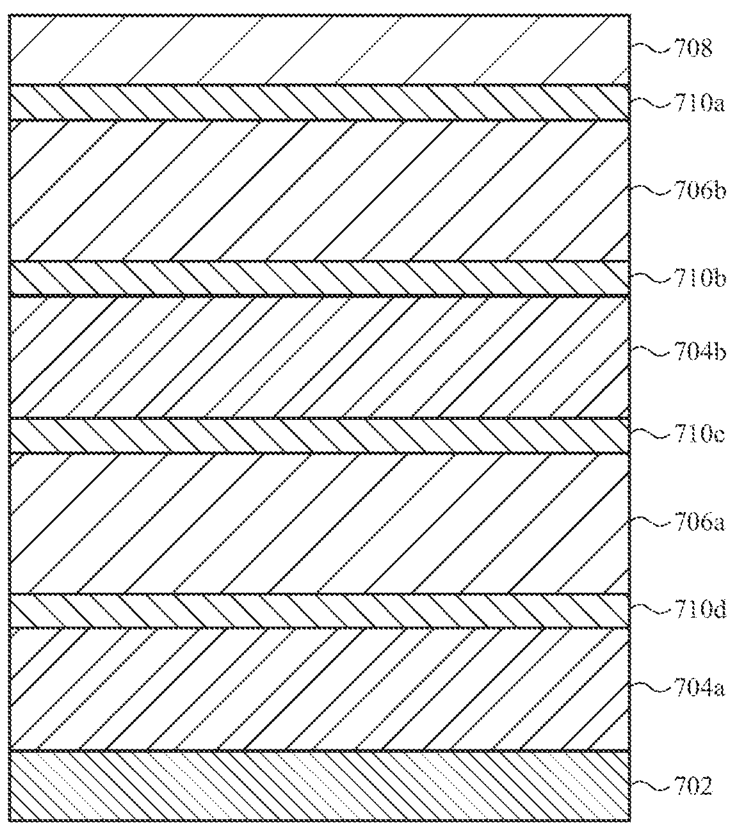

FIG. 7 shows an example of an electromagnetic radiation detector 700 that is configured as a dual-band electromagnetic radiation detector. The electromagnetic radiation detector includes an epitaxial stack including a substrate 702, a first set of buffer layers 704*a* (which may include a single buffer layer or a plurality of buffer layers), a first electromagnetic radiation absorber layer 706*a*, a second set of buffer layers 704*b* (which may include a single buffer layer or a plurality of buffer layers), a second electromagnetic radiation absorber layer 706*b*, and a cap layer 708. The first and second electromagnetic radiation absorber layers 706*a*. 706*b* may be configured to different ranges of wavelengths (which may or may not be partially overlapping), thereby increasing the overall wavelength range of light that may be detected by the electromagnetic radiation detector 700.

The electromagnetic radiation detector 700 may include an anti-reflective epitaxial structure between any two layers having a refractive index difference and for which it may be desirable to reduce internal Fresnel reflections. In the variation shown in FIG. 7, the electromagnetic radiation detector 700 includes a first anti-reflective epitaxial structure 710*a* connecting the cap layer 708 to the second electromagnetic radiation absorber layer 706*b*, a second anti-reflective epitaxial structure 710*b* connecting the second electromagnetic radiation absorber layer 706*b* to the second set of buffer layers 704*b*, a third anti-reflective epitaxial structure 710*c* connecting the second set of buffer layers 704*b* to the first electromagnetic radiation absorber layer 706*a*, and a fourth anti-reflective epitaxial structure 710*d* connecting the first electromagnetic radiation absorber layer 706*a* to the first set of buffer layers 704*a*. It should be appreciated that in other instances, the electromagnetic radiation detector 700 may include any subset of these anti-reflective epitaxial structures 710*a*-710*d*.

The anti-reflective epitaxial structures 710*a*-710*d* may each be included as any of the anti-reflective epitaxial structures described with respect to FIGS. 2-5C. For example, in some instances it may be desirable to prioritize reducing the thickness of the first and fourth anti-reflective epitaxial structures 710*a*. 710*d* and to prioritize the performance of the second and third anti-reflective epitaxial structures 710*b*, 710*c* across a range of wavelengths. In these instances, the first and fourth anti-reflective epitaxial structures 710*a*, 710*d* may each be configured as a wavelength-tuned interface (such as those described with respect to FIGS. 4 and 5A-5C), while the second and third anti-reflective epitaxial structures 710$b$, 710$c$ may be configured as a graded interface (such as those described with respect to FIGS. 2 and 3).

In one non-limiting example, the substrate 702 is formed from an indium phosphide material, the first set of buffer layers 704$a$, second set of buffer layers 704$b$, and the cap layer 708 are each formed from one or more indium arsenide phosphide materials, and the first and second electromagnetic radiation absorber layers 706$a$. 706$b$ may be formed from an indium gallium arsenide materials. It should be appreciated that different layers (e.g., the first and second electromagnetic radiation absorber layers) may be formed from different compositions of the same material (e.g., $In_xGa_{1-x}As$ with different values of x).

While the electromagnetic radiation detectors 600 and 700 shown in FIGS. 6 and 7 are depicted as planar detectors, it should be appreciated that any of the electromagnetic radiation detectors described herein may be formed with one or more mesas, and may further include additional components not depicted (e.g., a lens bonded to the epitaxial stack of the electromagnetic radiation detector, a lens etched or otherwise formed in the substrate, or the like). Similarly, it should be appreciated that any of the electromagnetic radiation detectors described herein may include one or more electrical contacts to facilitate operating the electromagnetic radiation detector, as will be readily understood by someone of ordinary skill in the art.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. An electromagnetic radiation detector, comprising:
an epitaxial stack comprising:
a first epitaxial layer;
a second epitaxial layer; and
an anti-reflective epitaxial structure connecting the first epitaxial layer to the second epitaxial layer, wherein:
the anti-reflective epitaxial structure comprises a plurality of layer groups; and
each layer group of the plurality of layer groups comprises a corresponding plurality of epitaxial layers with a different corresponding average refractive index.

2. The electromagnetic radiation detector of claim 1, wherein:
the first epitaxial layer has a higher refractive index than the second epitaxial layer; and
the average refractive indices of the plurality of epitaxial layers decrease in a direction from the first epitaxial layer to the second epitaxial layer.

3. The electromagnetic radiation detector of claim 1, wherein:
the first epitaxial layer, the second epitaxial layer, and the plurality of layer groups are lattice matched.

4. The electromagnetic radiation detector of claim 1, wherein:
the first epitaxial layer is formed from a first semiconductor material;
the second epitaxial layer is formed from a second semiconductor material; and
each layer group of the plurality of layer groups comprises:
a first layer formed from the second semiconductor material; and
a second layer formed from the first semiconductor material.

5. The electromagnetic radiation detector of claim 1, wherein each layer group of the plurality of layer groups has a common thickness.

6. The electromagnetic radiation detector of claim 1, wherein:
the first epitaxial layer is a buffer layer; and
the second epitaxial layer is an electromagnetic radiation absorber layer.

7. The electromagnetic radiation detector of claim 1, wherein:
the first epitaxial layer is a substrate; and
the second epitaxial layer is a buffer layer.

8. An electromagnetic radiation detector, comprising:
an epitaxial stack comprising:
a first epitaxial layer formed from a first semiconductor material;
a second epitaxial layer formed from a second semiconductor material; and
an anti-reflective epitaxial structure connecting the first epitaxial layer to the second epitaxial layer, wherein:
the anti-reflective epitaxial structure is formed from a layer of a semiconductor alloy material with varying composition between the first epitaxial layer and the second epitaxial layer; and
the first epitaxial layer, the second epitaxial layer, and the anti-reflective epitaxial structure are lattice matched.

9. The electromagnetic radiation detector of claim 8, wherein:
the semiconductor alloy material is a quaternary semiconductor material.

10. The electromagnetic radiation detector of claim 9, wherein:
the layer of the semiconductor alloy is graded from the first semiconductor material to the second semiconductor material.

11. The electromagnetic radiation detector of claim 10, wherein:
the first semiconductor material is an indium gallium arsenide material;
the second semiconductor material is an indium arsenide phosphide material; and
the semiconductor alloy material is an indium gallium arsenide phosphide material.

12. The electromagnetic radiation detector of claim 8, wherein:
the first epitaxial layer is a buffer layer; and
the second epitaxial layer is an electromagnetic radiation absorber layer.

13. An electromagnetic radiation detector, comprising:
an epitaxial stack comprising:
a substrate;
a first set of buffer layers positioned above the substrate;
a first electromagnetic radiation absorber layer positioned above the set of buffer layers;
a cap layer positioned above the electromagnetic radiation absorber layer; and a first anti-reflective epitaxial structure connecting the first electromagnetic radiation absorber layer to the cap layer.

14. The electromagnetic radiation detector of claim 13, wherein:

the epitaxial stack comprises a second anti-reflective epitaxial structure connecting the substrate to the first set of buffer layers.

15. The electromagnetic radiation detector of claim 14, wherein:

the cap layer has a first refractive index;

a buffer layer of the first set of buffer layers has a second refractive index; and the first anti-reflective epitaxial structure comprises a layer having a third refractive index that is the geometric mean of the first refractive index and the second refractive index.

16. The electromagnetic radiation detector of claim 15, wherein:

the second anti-reflective epitaxial structure comprises a plurality of layer groups; and each layer group of the plurality of layer groups comprises a corresponding plurality of epitaxial layers with a different corresponding average refractive index.

17. The electromagnetic radiation detector of claim 14, wherein:

the cap layer is formed from a first semiconductor material;

a buffer layer of the first set of buffer layers is formed from a second semiconductor material; and the first anti-reflective epitaxial structure comprises a first epitaxial layer formed from the first semiconductor material and a second epitaxial layer formed from the second semiconductor material.

18. The electromagnetic radiation detector of claim 17, wherein:

the first epitaxial layer and the second epitaxial layer have the same thickness.

19. The electromagnetic radiation detector of claim 13, wherein:

the epitaxial stack comprises a second set of buffer layers and a second electromagnetic radiation absorber layer.

20. The electromagnetic radiation detector of claim 19, wherein:

the epitaxial stack comprises a second anti-reflective epitaxial structure connecting the second electromagnetic radiation absorber layer to the second set of buffer layers.

* * * * *